(12) United States Patent
Sigurdardottir et al.

(10) Patent No.: US 6,501,333 B1
(45) Date of Patent: Dec. 31, 2002

(54) DIFFERENTIAL AMPLIFIER CIRCUIT

(75) Inventors: Anna Sigurdardottir, Wokingham (GB); Saul Darzy, Edgware (GB)

(73) Assignee: STMicroelectronics Limited, Buckinghamshire (GB)

( * ) Notice: Subject to any disclaimer, the term of this patent is extended or adjusted under 35 U.S.C. 154(b) by 0 days.

(21) Appl. No.: 09/888,086

(22) Filed: Jun. 21, 2001

(51) Int. Cl.$^7$ .............................. H03F 3/45; H03F 1/14
(52) U.S. Cl. ...................... 330/252; 330/257; 330/292
(58) Field of Search ................... 330/252, 257, 330/292

(56) References Cited

U.S. PATENT DOCUMENTS 4,607,235 A * 8/1986 Seevinck ............... 330/207 P
5,673,002 A * 9/1997 Kobayashi et al. ......... 330/288
5,990,742 A * 11/1999 Suzuki ....................... 330/253

* cited by examiner

*Primary Examiner*—Patricia Nguyen
(74) *Attorney, Agent, or Firm*—Lisa K. Jorgenson; David V. Carlson; Seed IP Law Group PLLC

(57) ABSTRACT

A differential amplifier circuit comprises: an amplifying section including first and second current branches and an output stage which comprises a current sinking element and a control element. The circuit also includes a current limiting section which comprises a current detecting element connected to detect the current through the current sinking element and arranged to drive the current limiting element when the detected current exceeds a predetermined threshold to inject current at the collector of the transistor in the first current branch.

6 Claims, 3 Drawing Sheets

DIFFERENTIAL AMPLIFIER CIRCUIT

TECHNICAL FIELD

This invention relates to a differential amplifier circuit.

BACKGROUND OF THE INVENTION

If a differential voltage is applied on the input of a transconductance amplifier, the amplifier sinks current from an output pin of the circuit, through a current sinking transistor to ground. The output voltage (an amplified version of the differential input) is developed across a load resistor connected to the output pin. When the transconductance amplifier is implemented on a chip, in order not to damage the chip it is advisable to limit the sinking current to a predetermined value.

SUMMARY OF THE INVENTION

According to the present invention there is provided a differential amplifier circuit comprising: an amplifying section for generating at an output node an amplified output dependent on a differential input voltage, said amplifying section including first and second current branches, each including a respective transistor, said transistors having their bases connected together and parallel collector paths an output stage comprising a current sinking element having a control node, and a controllable path connected to the output node, and a control element having a control node connected to the collector path of the second current branch and a controllable path connected to the control node of the current sinking element; and a current limiting section comprising a current detecting element connected to detect the current through the current sinking element and arranged to drive a current limiting element when the detected current exceeds a predetermined threshold to inject current at the collector of the transistor in the first current branch.

The current limiting section serves to limit the current sunk through the current sinking element by current feedback into its control node. In the described embodiment, the current sinking element, the control element, the current detecting element and the current limiting element are all implemented as bipolar transistors.

For a better understanding of the present invention and to show how the same may be carried into effect, reference will now be made by way of example to the accompanying drawings.

DESCRIPTION OF THE PREFERRED EMBODIMENT

Figure 1:
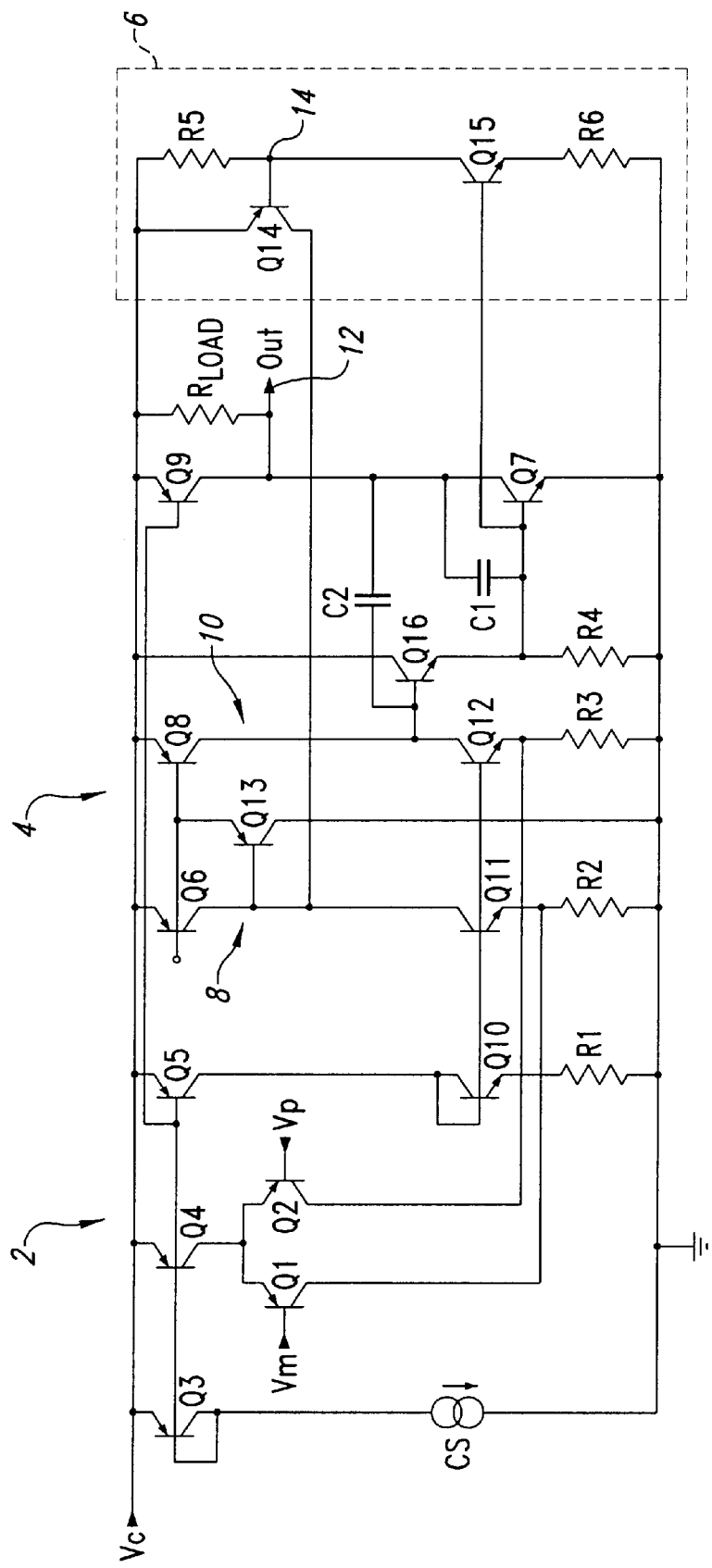
FIG. 1 is a circuit diagram of a differential amplifier including a current limitation stage.

FIG. 1 is a circuit diagram of a differential amplifier including an amplification stage 2, an output stage 4 and, in accordance with the described embodiment of the present invention, a current limitation stage 6.

The construction of the amplification stage 2 and the output stage 4 is largely conventional, apart from the interconnections with the current limitation stage 6. Therefore a complete description is not given in the following of the function of the amplification stage 2 and output stage 4, it being assumed that this will be familiar to a person skilled in the art. Only those aspects of these stages are discussed which are necessary for the understanding of the current limitation stage 6.

Nevertheless a brief discussion of the construction of the amplification stage 2 and output stage 4 is now given.

The amplification stage 2 comprises first and second differential amplifying transistors Q1, Q2 receiving respective differential voltage inputs $V_m$, $V_p$. The emitters of the differential amplifying transistors Q1, Q2 are connected together and to a supply rail $V_c$ via a transistor Q4. A diode connected transistor Q3 is connected in series with a current source CS between the voltage supply rail $V_c$ and ground. The base of the diode connected transistor Q3 is connected to the base of the transistor Q4. The base connection of the diode connected transistor Q3 drives the base of a transistor Q5 which is connected in series with a diode connected transistor Q10 and a resistor R1 between the voltage supply rail $V_c$ and ground. The base connection of the diode connected transistor Q3 also drives the base of an output transistor Q9 which forms part of the output of stage 4 and will be discussed in more detail hereinafter.

The collectors of the differential amplifying transistors Q1, Q2 are respectively connected into parallel legs of the amplifying circuit, each parallel leg comprising, connected in series between the voltage supply rail $V_c$ and ground, base connected transistors Q6, Q8, base connected transistors Q11, Q12 and resistors R2, R3. The collectors of the differential amplifying transistors Q1, Q2, are connected between the respective base connected transistors Q11, Q12 and their associated resistors R2, R3. The bases of the transistors Q11, Q12 are connected to the base of the diode connected transistor Q10 discussed above. A transistor Q13 has its base connected between the transistor Q6 and the collector of transistor Q11 of the first parallel leg 8. Its emitter is connected to the bases of the transistors Q6, Q8 of the parallel legs 8, 10 respectively. Its collector is connected to ground.

The output stage 4 comprises a control element in the form of a transistor Q16, and the output transistor Q9 already mentioned which has its emitter connected to the supply rail $V_c$ and its collector connected to the collector of a current sinking transistor Q7. An output resistor $R_{LOAD}$ is connected between an output terminal 12 (at the collector of the output transistor Q9) and the supply rail $V_c$. The load resistor can just as well be connected to another voltage source (positive power supply). The only condition is that the op-voltage at the output terminal is low enough to keep Q9 working in forward active mode and high enough to keep Q7 working in forward active mode.

The emitter of the current sinking transistor Q7 is connected to ground. Its base is connected to its collector via a capacitor C1, to ground via a resistor R4 and to the emitter of the transistor Q16. The base of the control transistor is connected to the collector of the current sinking transistor Q7 via a capacitor C2.

With the current limitation stage in place (described later), current is injected through the transistor Q11. This increases the base-emitter voltage at Q11 and (since the bases of Q11 and Q12 are connected together) the base-emitter voltage at the transistor Q12 as well. This decreases the base current of the transistor Q16. Since the value of R4 is quite high, it can be said that the transistors Q16 and Q7 form a Darlington pair (i.e. almost the full amount of the emitter current of Q16 goes into the base of Q7).

The current limitation stage 6 will now be described. It comprises a current detecting transistor having its collector connected via a resistor R5 to the supply rail $V_c$ and its emitter connected via a resistor R6 to ground. Its base is connected to the base of the current sinking transistor Q7. These transistors have different areas. When the collector current through Q7 reaches some certain value the base-emitter voltage reaches a certain corresponding value. Depending on the area ratio of the transistors and on the size of R6 the transistor Q15 will be switched on when its base-emitter voltage is large enough.

A current limiting transistor Q14 has its base connected at a node 14 between the resistor R5 and the collector of the transistor Q15. The emitter of the current limiting transistor Q14 is connected to the supply rail $V_c$. The collector of the current limiting transistor Q14 is connected to the collector of the transistor Q11 in the first parallel leg 8.

Operation of the current limitation stage 6 will now be described. If the current through the output drive transistor Q7 becomes too large, the first current limiting transistor Q15 is turned on by current injected into its base as described above.

When the current detecting transistor Q15 is turned on, current flows through the resistor R5 which causes the current limiting transistor Q14 to be turned on by base current drive. The collector current of the transistor Q14 is accordingly increased and is injected into the collector of the transistor Q11 in the first parallel leg 8. This negative feedback leads to a reduction in the base current for the transistor Q16 and thus a reduction in the base current of the output drive transistor Q7. This therefore limits the maximum value of the collector current of the output drive transistor Q7, and thus limits the current through the load transistor $R_{LOAD}$.

Assuming that the transistors are working in forward active mode, the following equations can be used to describe the relation between current I and voltage U for the relevant transistors, where the following denotation applies:

$I_E$=emitter current $I_s$=saturation current $U_{BE}$=base emitter voltage $U_T$=threshold voltage $I_{E,Q7}$ is the emitter current for the transistor Q7, other numbers and denotations applying accordingly.

$I_{E,Q7}=I_{s,Q7}\exp(U_{BE,Q7}/U_T)$   Equation 1

$I_{E,Q15}=I_{s,Q15}\exp(U_{BE,Q15}/U_T)$   Equation 2

$U_{BE,Q7}=U_{BE,Q15}+I_{E,Q15}R_6$   Equation 3

$I_{E,Q15}/I_{E,Q7}=I_{s,Q15}/I_{s,Q7}\exp((U_{BE,Q15}-U_{BE,Q7})/U_T)$   Equation 4

$U_{BE,Q15}-U_{BE,Q7}=-I_{E,Q15}R_6$ (from Equation 3)   Equation 5

$I_{E,Q7}/I_{E,Q15}=I_{s,Q7}/I_{s,Q15}\exp((I_{E,Q15}R_6)/U_T)$   Equation 6

Thus, equation 6 gives the relationship between the emitter currents for transistors Q7 and Q15 in terms of their saturation currents, the value of the resistor R6 and the transistor threshold voltage.

It is thus possible to determine from this equation a value of the resistor R6 to limit the output current at a desired level. If transistors Q7 and Q15 are chosen to be of the same type, their saturation currents $I_{s,Q7}, I_{s,Q15}$ will be directly proportional to the transistor areas $A_{Q15}, A_{Q7}$ respectively. If a limiting value for the output current is selected for both current branches, denoted $I_{Q15,limit}, I_{Q7,limit}$ then the appropriate resistor value for R6 can be written as:

$R_{41}=U_T/I_{Q15,limit} \ln((I_{Q7,limit}/I_{Q15,limit})(A_{Q40}/A_{Q7}))$   Equation 7

Note that R41→R6 and AQ40→AQ15.

The value for the resistor R5 is chosen to give the correct voltage drop to turn the second current limiting transistor Q14 on, that is:

$R5=U_{BE,Q14}/I_{E,Q15}$.

Figure 2:
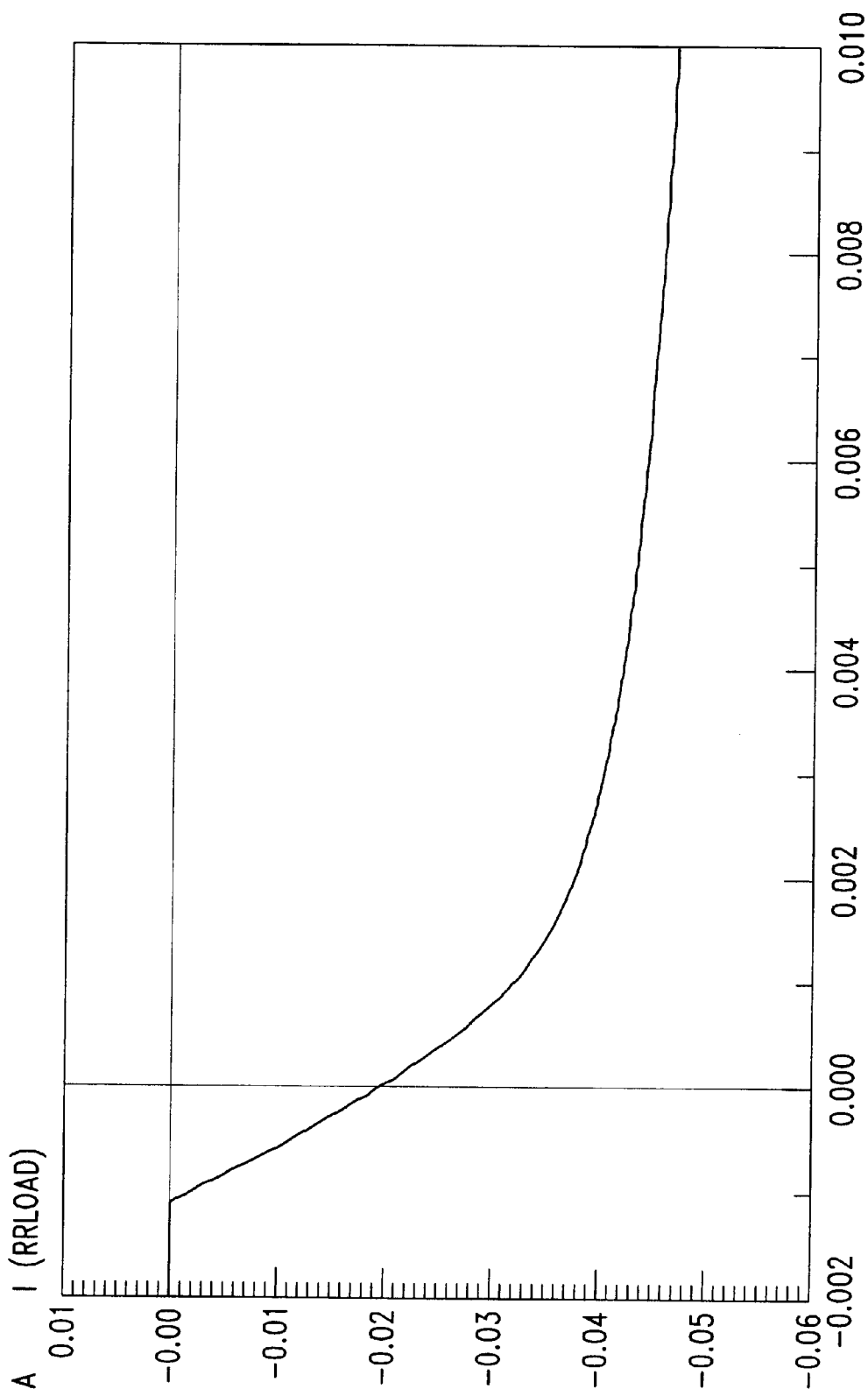
FIG. 2 is a graph showing the current through a load resistor against differential input voltage.
Figure 3:
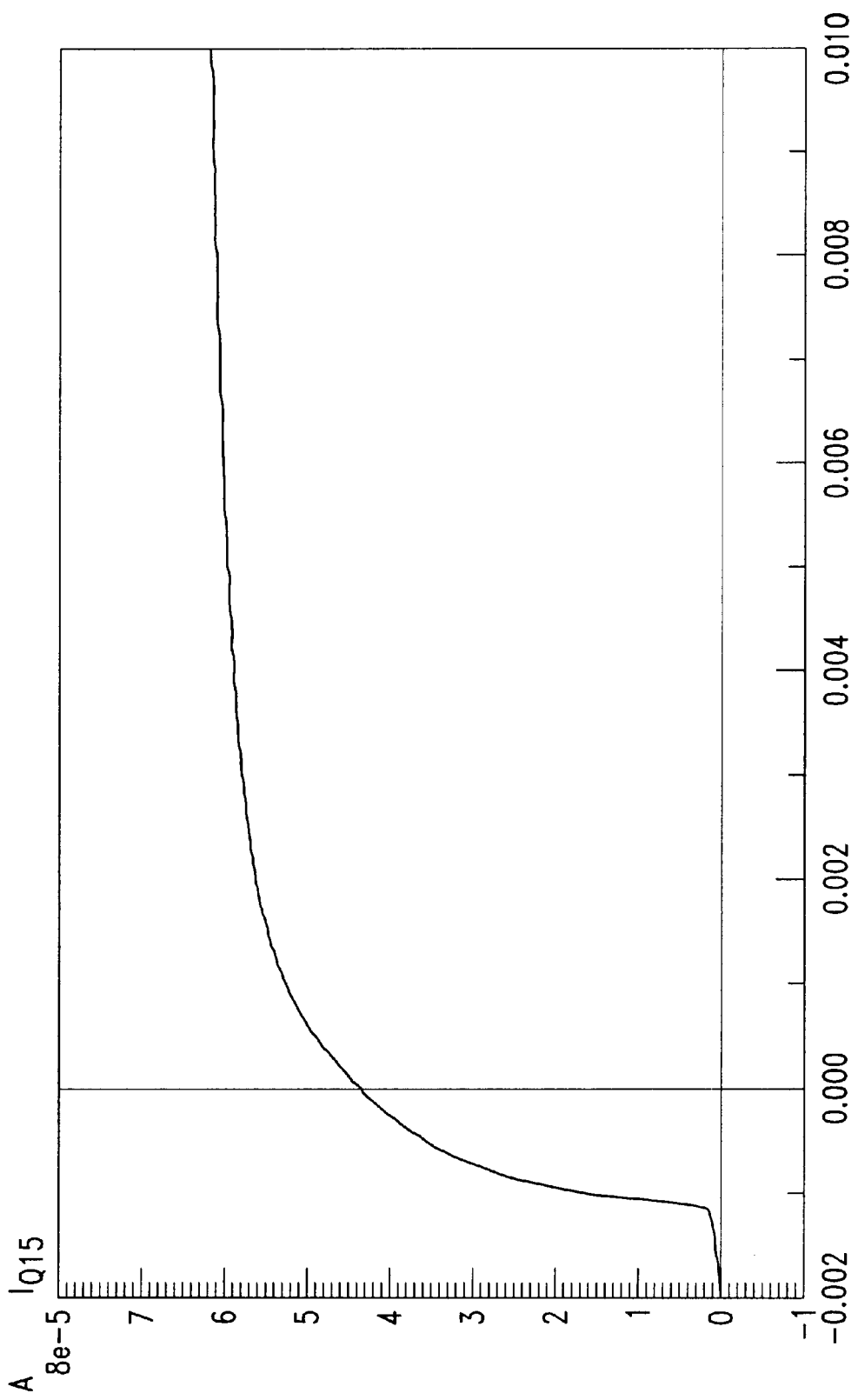
FIG. 3 is a graph showing the collector current through a current limiting element in relation to differential input voltage to the amplifier.

FIG. 2 illustrates the effect of the current limiting circuit on the output current through the load resistor $R_{LOAD}$. Initially, the current tends to sink fairly rapidly, with increasing differential input voltage ($V_m-V_p$), but flattens out as can be seen around a differential input voltage of around 0.001V due to the effect of the current limitation circuit as illustrated in FIG. 3. FIG. 3 illustrates the collector current through the current limiting transistor Q15 as a function of differential input voltage. The current increases until the differential input voltage is around 0.001V, and then flattens out due to the negative feedback described above.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A differential amplifier circuit comprising:
   an amplifying section for generating at an output node an amplified output dependent on a differential input voltage, said amplifying section including first and second current branches, each including a respective transistor, said transistors having their bases connected together and parallel collector paths, an output stage comprising a current sinking element having a control node, and a controllable path connected to the output node, and a control element having a control node connected to the collector path of the second current branch and a controllable path connected to the control node of the current sinking element; and
   a current limiting section comprising a current detecting element connected to detect the current through the current sinking element and arranged to drive a current limiting element when the detected current exceeds a predetermined threshold to inject current at the collector of the transistor in the first current branch.

2. A differential amplifier circuit according to claim 1 wherein the current sinking element is a bipolar transistor.

3. A differential amplifier circuit according to claim 1 wherein the current branches include respective further transistors in series with said transistors, said further transistors likewise having their bases connected together.

4. A differential amplifier circuit according to claim 1 wherein the current detecting element is a bipolar transistor having its base connected to the control node of the current sinking element.

5. A differential amplifier circuit according to claim 1 wherein the current limiting element comprises a bipolar transistor having its base connected to a controllable path of the current detecting element.

6. A differential amplifier circuit according to claim 4 wherein the current detecting transistor has its emitter connected to a reference voltage via a resistor, the value of the resistor being selected to determine said predetermined threshold of current.

* * * * *

UNITED STATES PATENT AND TRADEMARK OFFICE
CERTIFICATE OF CORRECTION

PATENT NO.   : 6,501,333 B1
DATED        : December 31, 2002
INVENTOR(S)  : Anna Sigurdardottir et al.

It is certified that error appears in the above-identified patent and that said Letters Patent is hereby corrected as shown below:

<u>Title page,</u>
Item [65], the Prior Publication Data should read as:
-- US 2002-0196079 A1 Dec. 26, 2002 --.

Signed and Sealed this

Twenty-ninth Day of July, 2003

JAMES E. ROGAN
*Director of the United States Patent and Trademark Office*